(12) United States Patent
Iwai

(10) Patent No.: US 8,982,580 B2
(45) Date of Patent: Mar. 17, 2015

(54) ELECTRONIC DEVICE

(71) Applicant: KYOCERA Corporation, Kyoto-shi, Kyoto (JP)

(72) Inventor: Akito Iwai, Osaka (JP)

(73) Assignee: KYOCERA Corporation, Kyoto (JP)

( * ) Notice: Subject to any disclaimer, the term of this patent is extended or adjusted under 35 U.S.C. 154(b) by 170 days.

(21) Appl. No.: 13/859,142

(22) Filed: Apr. 9, 2013

(65) Prior Publication Data

US 2013/0271943 A1  Oct. 17, 2013

(30) Foreign Application Priority Data

Apr. 13, 2012 (JP) ................ 2012-091668

(51) Int. Cl.
*H05K 9/00* (2006.01)
*G06F 1/16* (2006.01)
*H04M 1/02* (2006.01)

(52) U.S. Cl.
CPC .............. *H05K 9/0007* (2013.01); *G06F 1/16* (2013.01); *H04M 1/0202* (2013.01)
USPC . 361/816; 361/679.01; 361/807; 361/679.31; 361/679.37; 361/679.55; 361/752; 361/760; 361/829; 29/428

(58) Field of Classification Search
USPC .............. 361/679.01, 807, 679.31, 679.37, 361/679.55, 752, 760, 829; 29/428
See application file for complete search history.

(56) References Cited

U.S. PATENT DOCUMENTS

| | | | | |
|---|---|---|---|---|
| 5,581,443 A | * | 12/1996 | Nakamura et al. | 361/705 |
| 5,784,256 A | * | 7/1998 | Nakamura et al. | 361/699 |
| 2009/0073671 A1 | * | 3/2009 | Lin | 361/816 |
| 2010/0072952 A1 | * | 3/2010 | Nakajima | 320/150 |
| 2010/0075525 A1 | * | 3/2010 | Imamura | 439/325 |
| 2010/0258626 A1 | * | 10/2010 | Watanabe et al. | 235/380 |
| 2011/0249411 A1 | * | 10/2011 | Hayashiyama | 361/752 |

FOREIGN PATENT DOCUMENTS

| | | |
|---|---|---|
| JP | 2009-100402 A | 5/2009 |
| JP | 2010-028871 A | 2/2010 |

* cited by examiner

*Primary Examiner* — Robert J Hoffberg
*Assistant Examiner* — Michael Matey
(74) *Attorney, Agent, or Firm* — Procopio, Cory, Hargreaves & Savitch, LLP.

(57) ABSTRACT

In an electronic device according to the present invention, a shield case is disposed at a surface of a main board so as to cover at least a part of a region of the surface of the main board; and an auxiliary board is disposed at a surface of the shield case. The shield case is comprised of a metallic frame that is fixed at the surface of the main board and extends in such a manner as to surround at least the part of the region, and a metallic cover fitted into the metallic frame to cover at least the part of the region. A projecting piece is formed in the metallic frame of the shield case, and penetrates the metallic cover and projects toward the auxiliary board. An end face of the auxiliary board abuts against the projecting piece, so as to position the auxiliary board.

3 Claims, 9 Drawing Sheets

F I G. 3
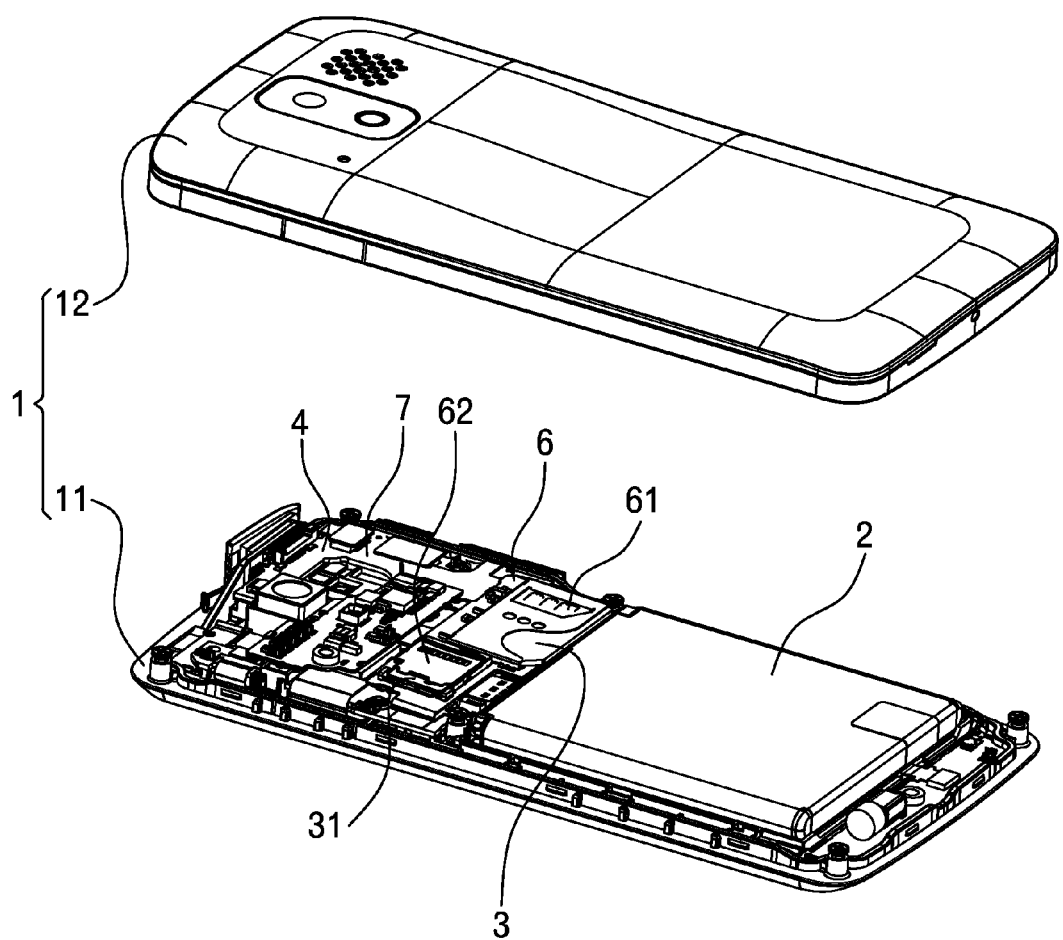

CROSS SECTION TAKEN ALONG LINE IV—IV

ENLARGEMENT OF PART A

ENLARGEMENT OF PART B

ENLARGEMENT OF PART C

ENLARGEMENT OF PART D

CROSS SECTION TAKEN ALONG LINE XIII – XIII

ENLARGEMENT OF PART E

ELECTRONIC DEVICE

This application claims priority to Japanese Patent Application No. 2012-091668. The entirety of Japanese Patent Application No. 2012-091668 is incorporated by reference herein.

BACKGROUND OF THE INVENTION

1. Field of the Invention

The present invention relates to an electronic device such as a cellular mobile phone and, more particularly, to an electronic device having a shield structure with respect to a high frequency component part.

2. Description of Related Art

Conventionally, a cellular mobile phone has incorporated therein a board assembly 90 shown in FIG. 15. In the board assembly 90, a plurality of IC chips 94, 95 constituting a high frequency circuit are mounted on a main board 9. These IC chips 94, 95 are covered with a shield case 91 mounted on the main board 9.

The shield case 91 is constituted of a metallic frame 93 securely soldered onto the main board 9 and a metallic cover 92 fitted into the metallic frame 93.

In order to pack a plurality of component parts incorporated in a cellular mobile phone in a high density, an auxiliary board 96 having a plurality of component parts 97, 98 mounted thereon is securely stuck onto the shield case 91 via a double-faced adhesive tape or the like.

In the above cellular mobile phone, the component parts 97, 98 mounted on the auxiliary board 96 may be required to be positioned with high accuracy.

In this case, it is conceived that a positioning piece (not shown) projects from the metallic cover 92 constituting the shield case 91, and then, an end face of the auxiliary board 96 abuts against the positioning piece, thus securing the positioning accuracy of the component parts 97, 98 mounted on the auxiliary board 96.

However, in the structure in which the positioning piece of the metallic cover 92 constituting the shield case 91 secures the positioning accuracy of the component parts 97, 98, fitting tolerances and shape tolerances of the metallic cover 92 with respect to the metallic frame 93 are superimposed on the positional deviation tolerances and shape tolerances of the metallic frame 93 securely soldered onto the main board 9, thereby adversely influencing the positioning accuracy of the auxiliary board 96 on the main board 9. As a consequence, there arises a problem that the superimposition of the tolerances obstructs securing of the high positioning accuracy of the component parts 97, 98 on the auxiliary board 96.

In view of the above problem, an object of the present invention is to enhance the positioning accuracy of an auxiliary board on a main board more than that in the conventional art in an electronic device provided with the auxiliary board on the main board via a shield case.

SUMMARY OF THE INVENTION

In an electronic device according to the present invention, a main board is housed inside of a casing; a shield case is disposed at a surface of the main board so as to cover at least a part of a region of the surface of the main board; and an auxiliary board is disposed at a surface of the shield case. The shield case is constituted of a metallic frame that is fixed at the surface of the main board and extends in such a manner as to surround at least the part of the region, and a metallic cover fitted to the metallic frame to cover at least the part of the region.

A projecting piece is formed at the metallic frame of the shield case in such a manner as to penetrate the metallic cover and project toward the auxiliary board. An end face of the auxiliary board abuts against the projecting piece, thus positioning the auxiliary board.

BRIEF DESCRIPTION OF THE DRAWINGS

FIG. 3 is an exploded perspective view showing the cellular mobile phone;

DETAILED DESCRIPTION OF THE PREFERRED EMBODIMENT

Figure 1:
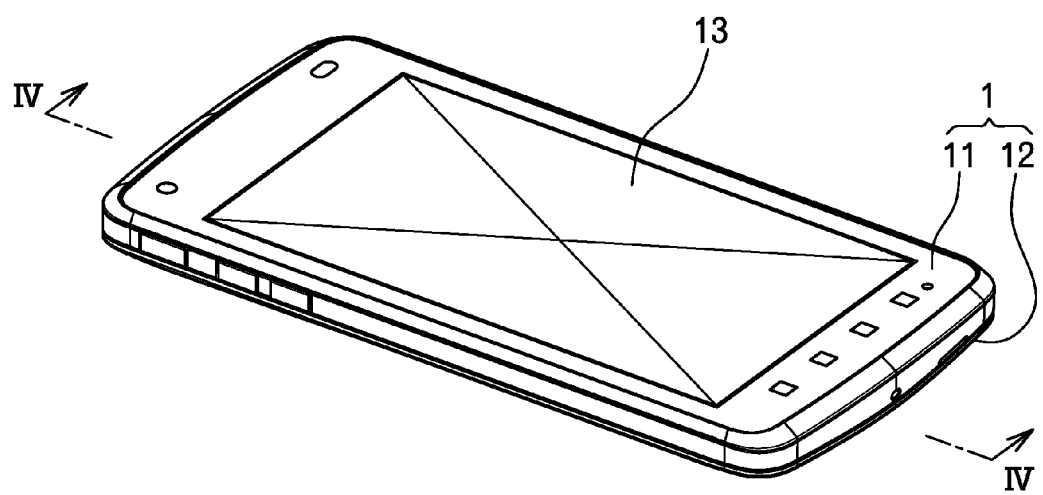
FIG. 1 is a perspective view showing a cellular mobile phone according to one embodiment of the present invention.

An embodiment in which the present invention is applied to a cellular mobile phone will be described specifically along the drawing.

Figure 2:
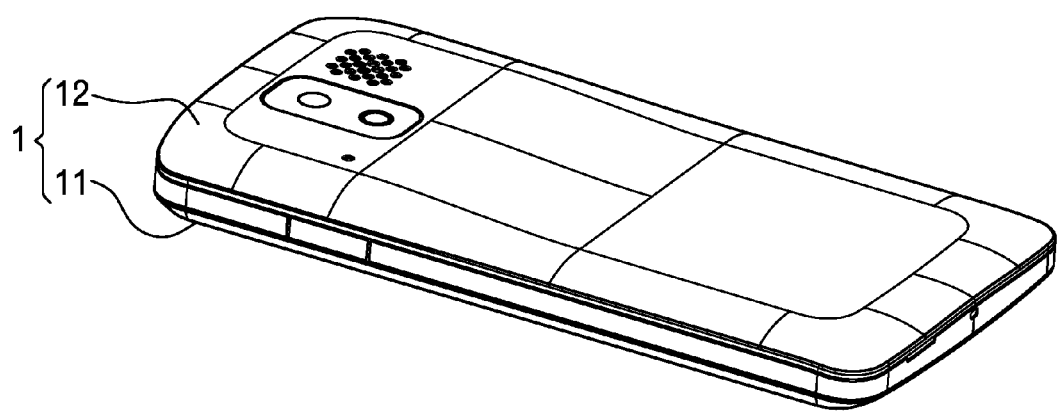
FIG. 2 is a perspective view showing the back surface of the cellular mobile phone.

A cellular mobile phone according to one embodiment of the present invention is provided with a flat casing 1 having a front cabinet 11 and a back cabinet 12 coupled to each other, as shown in FIGS. 1 and 2. A screen of a display 13 is exposed to the outside from the surface of the front cabinet 11.

Figure 4:
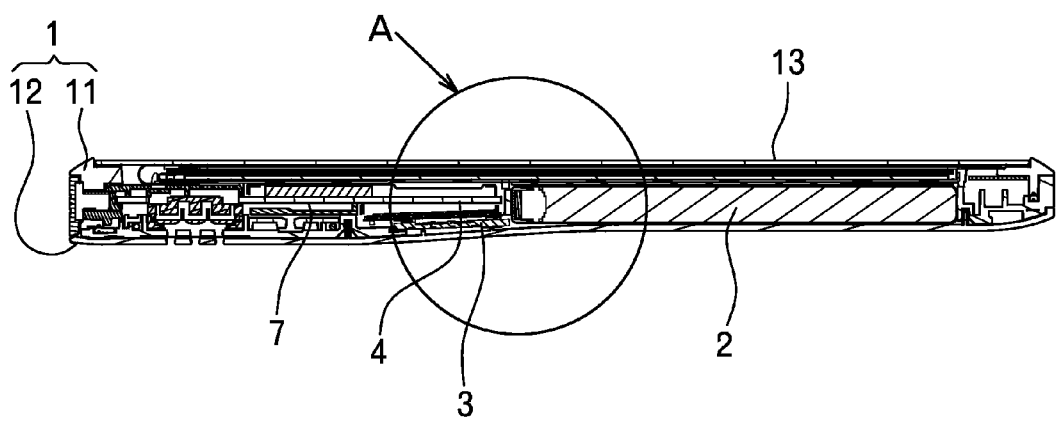
FIG. 4 is a cross-sectional view taken along line IV-IV of FIG. 1.

As shown in FIGS. 3 and 4, a board assembly 7 and a battery 2 for supplying an electric power to the board assembly 7 are housed inside of the casing 1.

Figure 6:
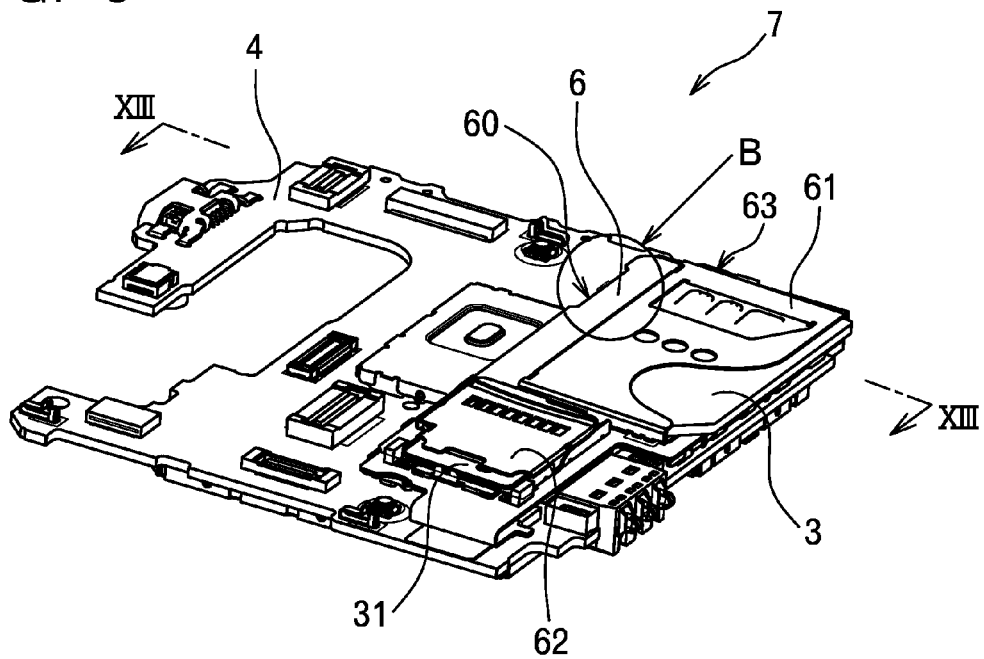
FIG. 6 is a perspective view showing a board assembly in the cellular mobile phone.
Figure 7:
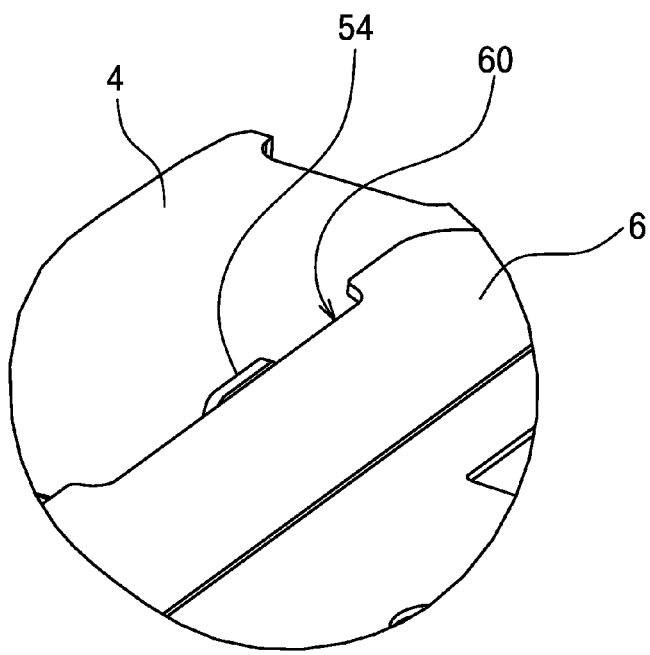
FIG. 7 is an enlarged perspective view showing a part B of FIG. 6.
Figure 8:
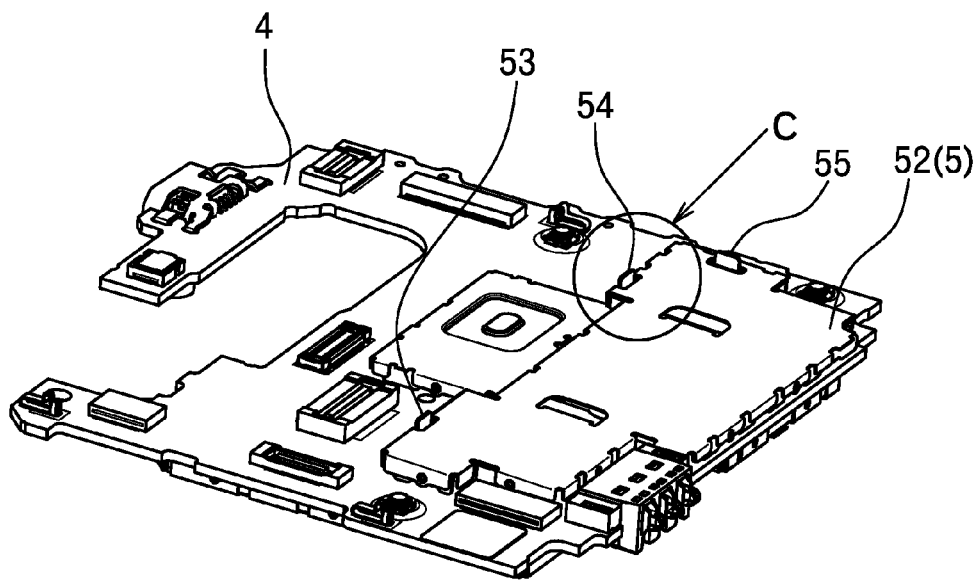
FIG. 8 is a perspective view showing a state in which an auxiliary board is detached from the board assembly.

As shown in FIG. 6, the board assembly 7 is provided with a main board 4 and an auxiliary board 6 mounted on the main board 4. Moreover, a shield case 5 shown in FIG. 8 is interposed between the main board 4 and the auxiliary board 6.

a plurality of IC chips are mounted on the main board 4. Among the IC chips, one or more IC chips (not shown) constituting a high frequency circuit are covered with the shield case 5.

Figure 12:
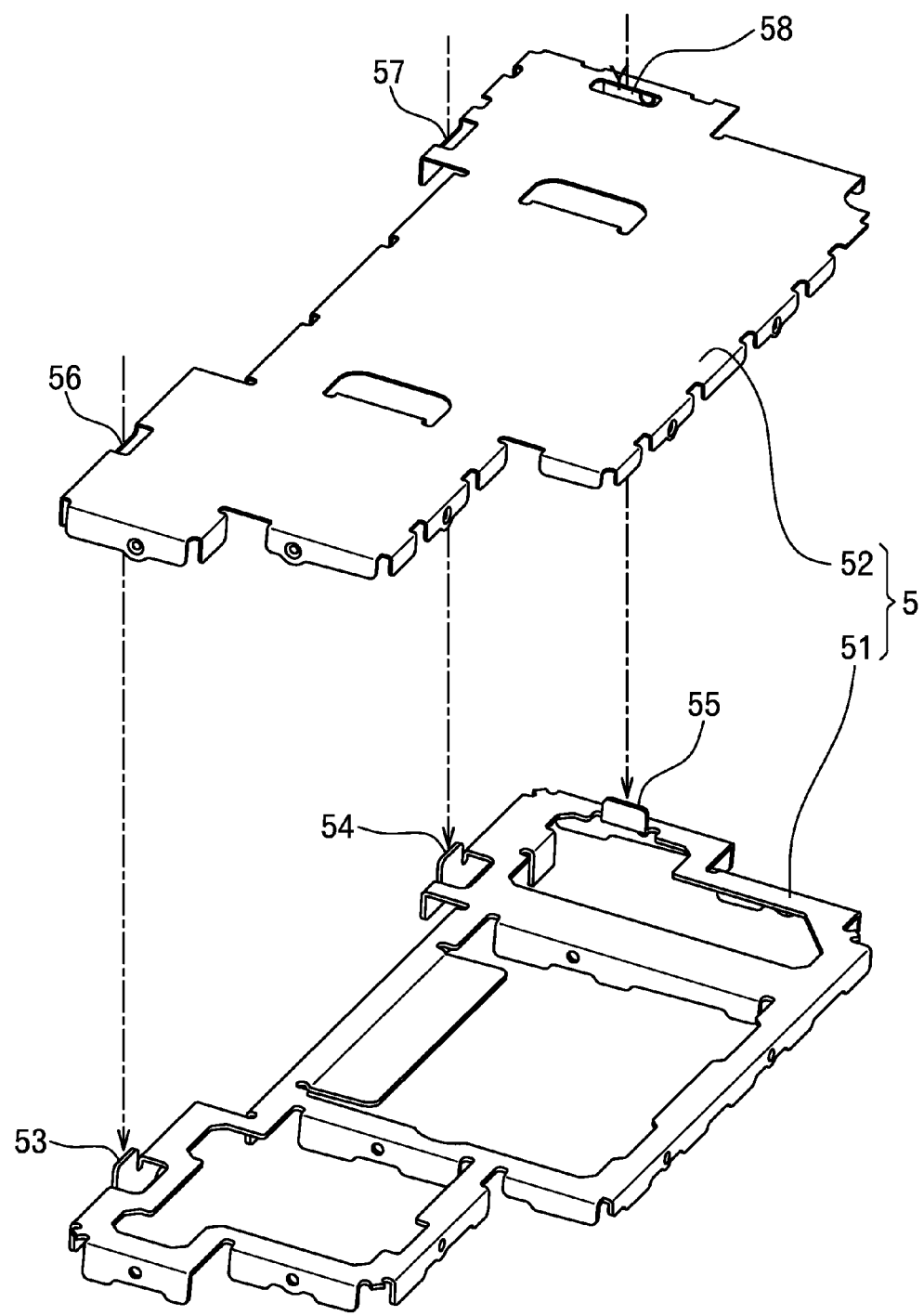
FIG. 12 is an exploded perspective view showing the shield case.

As shown in FIG. 12, the shield case 5 is constituted of a metallic frame 51 and a metallic cover 52 that are made of an SUS sheet metal.

Figure 10:
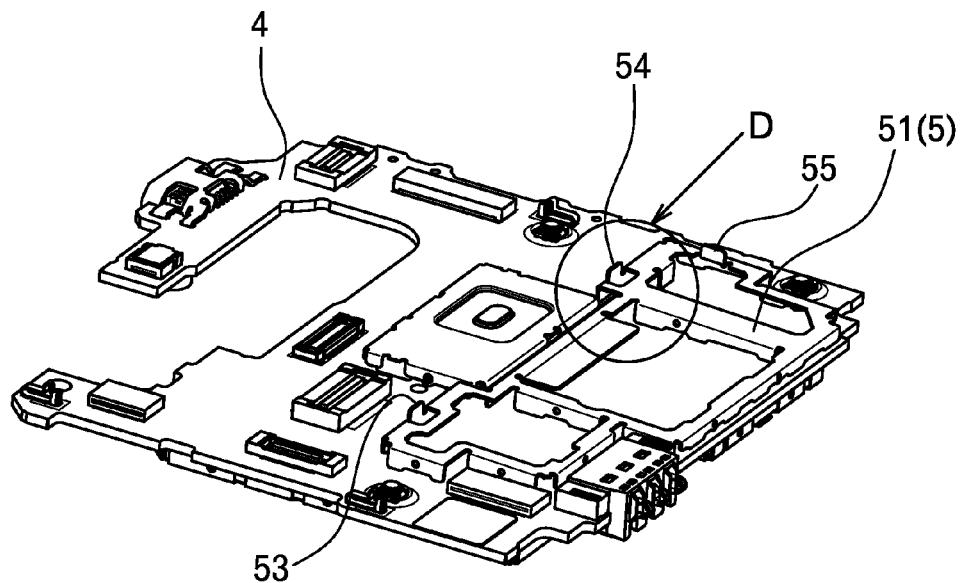
FIG. 10 is a perspective view showing a state in which the auxiliary board and a metallic cover of a shield case are detached from the board assembly.

As shown in FIG. 10, the metallic frame 51 is securely soldered onto the main board 4. In this manner, the metallic frame 51 is kept at a ground potential.

The metallic frame 51 extends in such a manner as to surround a region in which one or more IC chips (not shown) constituting the high frequency circuit are arranged. Further, the outer periphery of the metallic cover 52 shown in FIG. 12 is fitted into the outer periphery of the metallic frame 51.

Figure 11:
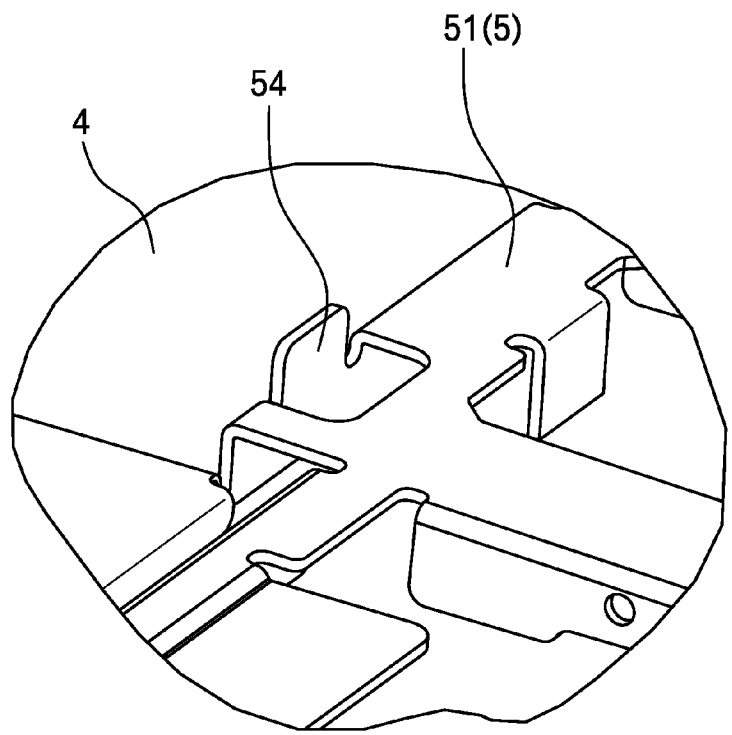
FIG. 11 is an enlarged perspective view showing a part D of FIG. 10.

Three projecting pieces 53, 54, and 55 projecting toward the metallic cover 52 are molded integrally with the outer periphery of the metallic frame 51 (see FIG. 11). Three slits 56, 57, and 58 are formed at the metallic cover 52 in such a manner as to correspond to the three projecting pieces 53, 54, and 55, respectively, as shown in FIG. 12.

Figure 9:
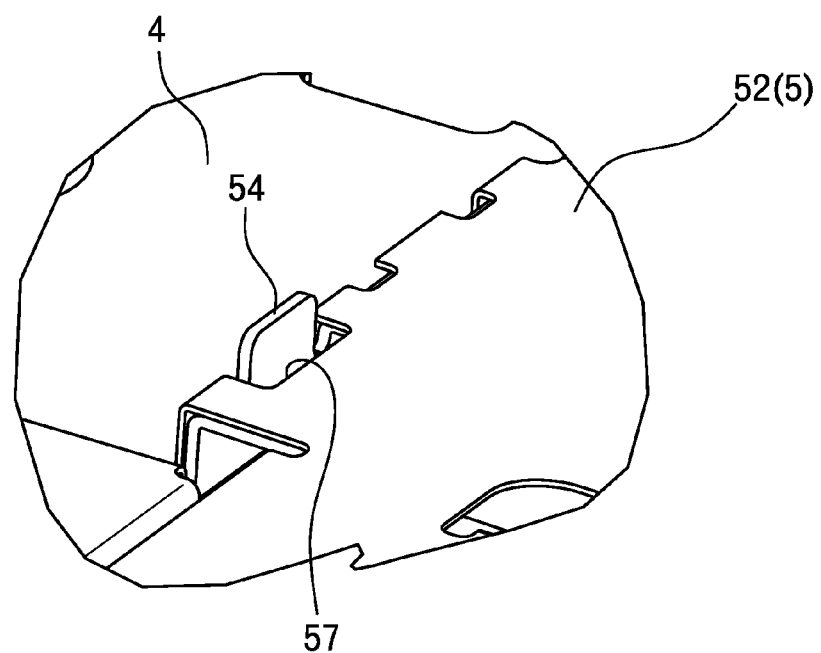
FIG. 9 is an enlarged perspective view showing a part C of FIG. 8.

The metallic cover 52, as shown in FIG. 8, is fitted into the metallic frame 51 securely mounted on the main board 4, as shown in FIG. 10. In this manner, the three projecting pieces 53, 54, and 55 are inserted into the three slits 56, 57, and 58 with a clearance, respectively, while the tips thereof project upward of the surface of the metallic cover 52 (see FIG. 9).

Onto the metallic cover 52 of the shield case 5 covering the main board 4 is securely stuck the auxiliary board 6 having an SIM card socket 61 and a memory card socket 62 mounted thereon via a double-faced adhesive tape (not shown), as shown in FIG. 6.

In the auxiliary board 6, two end faces 60, 63 that are perpendicular to each other abut against the tip ends of the three projecting pieces 53, 54, and 55 projecting from the surface of the shield case 5, thus positioning the auxiliary board 6 in two axial directions perpendicular to each other.

One end face 60 of the auxiliary board 6 is perpendicular to the insertion direction of a SIM card 3 to be inserted into the SIM card socket 61. The end face 60 abuts against the two projecting pieces 53, 54 of the shield case 5, so that the auxiliary board 6 can be positioned in the insertion direction.

On the other hand, the other end face 63 of the auxiliary board 6 abuts against the projecting piece 55 of the auxiliary board 6, so that the auxiliary board 6 can be positioned in a direction perpendicular to the insertion direction.

Figure 13:
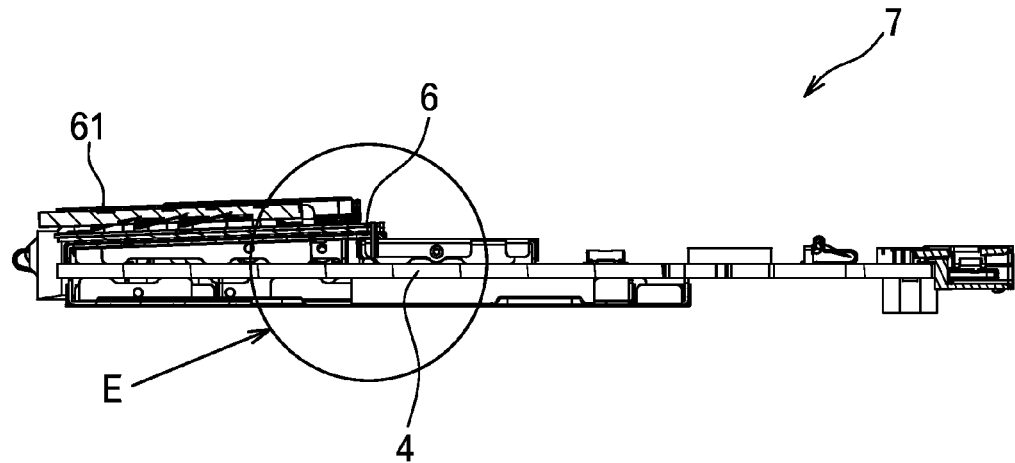
FIG. 13 is a cross-sectional view taken along line XIII-XIII of FIG. 6.
Figure 14:
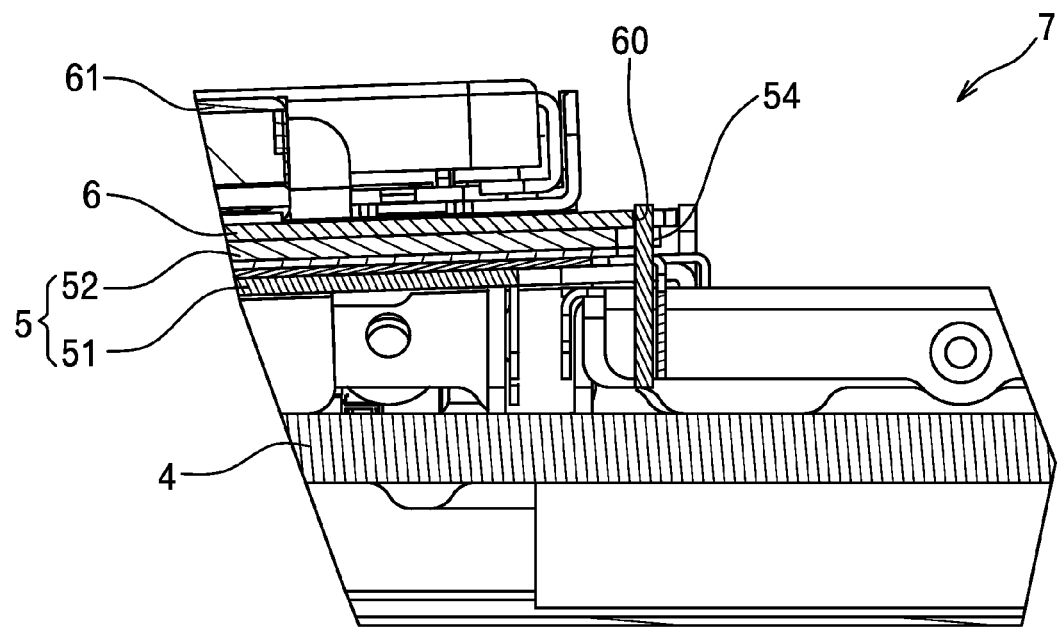
FIG. 14 is an enlarged cross-sectional view showing a part E of FIG. 13.
Figure 15:
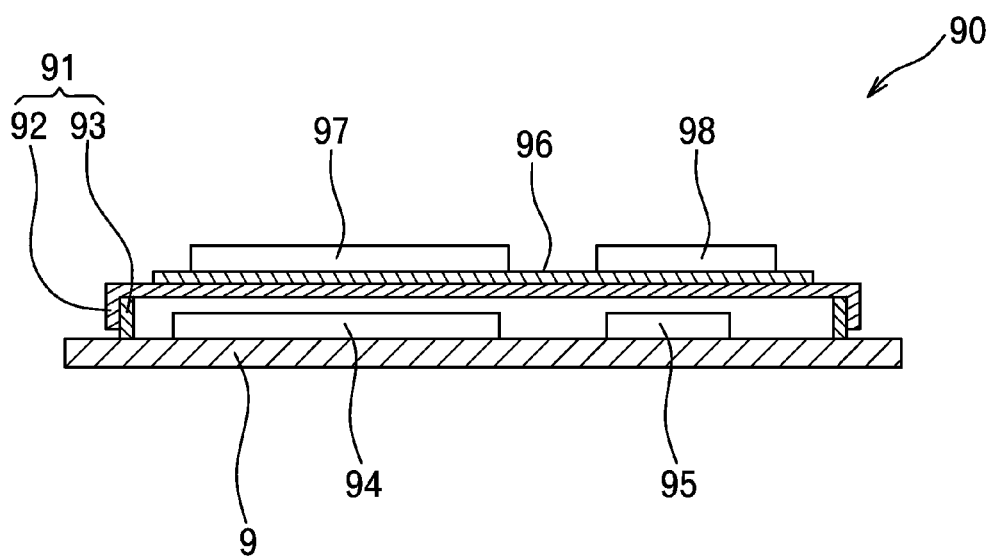
FIG. 15 is a cross-sectional view showing a board assembly in a conventional cellular mobile phone.

As shown in FIGS. 13 and 14, the end face 60 of the auxiliary board 6 abuts against the tip end of the projecting piece 54 of the shield case 5, thus positioning the auxiliary board 6 in the insertion direction, so as to enhance the positioning accuracy of the SIM card socket 61 disposed on the auxiliary board 6.

As shown in FIG. 3, the SIM card 3 is inserted into the SIM card socket 61 whereas a memory card 31 is inserted into the memory card socket 62.

Figure 5:
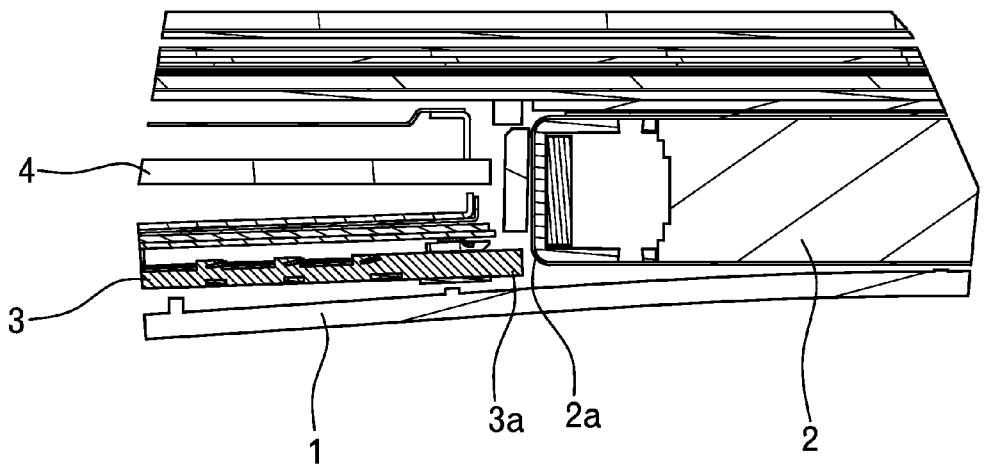
FIG. 5 is an enlarged cross-sectional view showing a part A of FIG. 4.

As shown in FIG. 5, an end part 3a of the SIM card 3 faces an end part 2a of the battery 2 that prevents the end part 3a of the SIM card 3 from slipping.

As described above, the three projecting pieces 53, 54, and 55 formed at the metallic frame 51 of the shield case 5 penetrate the metallic cover 52, and further, the two end faces 60 and 63 of the auxiliary board 6 abut against the projecting pieces 53, 54, and 55, thus positioning the auxiliary board 6 in the two axial directions. Consequently, only the positional deviation tolerances and shape tolerances of the metallic frame 51 with respect to the main board 4 influence the positioning accuracy of the auxiliary board 6 on the main board 4 without any adverse influence by the fitting tolerances and shape tolerances of the metallic cover 52 with respect to the metallic frame 51.

As a result, the auxiliary board 6 can be positioned on the main board 4 with high accuracy.

Consequently, the SIM card 3 inserted into the SIM card socket 61 can be positioned on the auxiliary board 6 with enhanced accuracy, thus defining a clearance between the end part 3a of the SIM card 3 and the end part 2a of the battery 2, as shown in FIG. 5, with high accuracy, so as to securely prevent the SIM card 3 from slipping.

Incidentally, the configuration of each of the constituent parts according to the present invention is not limited to those described preferred embodiment. Various changes can be made by those skilled in the art within the range not departing from the spirit of the present invention. For example, although the two end faces of the auxiliary board, the faces being perpendicular to each other, abut against the three projecting pieces of the shield case, thus positioning the auxiliary board in the two axial directions in the above embodiment, the configuration provided with one or two projecting pieces for positioning an auxiliary board only in one axial direction may be adopted in such a case.

Moreover, the present invention is not limited to the configuration in which the auxiliary board only abuts against the projecting pieces of the shield case. The present invention may adopt a configuration in which a lock portion is formed at the tip of a projecting piece that positions and locks an auxiliary board.

Additionally, the component part mounted on the auxiliary board is not limited to the card socket but may be various component parts such as a key sheet that requires securing of positioning accuracy.

What is claimed is:

1. An electronic device comprising:
a main board to be housed inside of a casing;
a shield case disposed at a surface of the main board so as to cover at least a part of a region of the surface of the main board;
an auxiliary board disposed at a surface of the shield case, the auxiliary board having one or more component parts mounted on a surface of the auxiliary board, the one or more component parts include a socket into which a card is to be inserted; and
a battery housed inside of the casing, and an end part of the battery prevents the card inserted into the card socket from slipping,
wherein the shield case is constituted of a metallic frame that is fixed at the surface of the main board and extends in such a manner as to surround at least the part of the region, and a metallic cover fitted to the metallic frame to cover at least the part of the region; and
wherein a projecting piece is formed at the metallic frame of the shield case in such a manner as to penetrate the metallic cover and project toward the auxiliary board, an end face of the auxiliary board abutting against the projecting piece, so as to position the auxiliary board.

2. The electronic device according to claim 1, wherein the projecting piece of the metallic frame is molded integrally with the metallic frame.

3. The electronic device according to claim 1, wherein a slit, into which the projecting piece of the metallic frame penetrates with a clearance, is formed in the metallic cover.

* * * * *